United States Patent
Bhardwaj et al.

(10) Patent No.: US 6,259,209 B1
(45) Date of Patent: *Jul. 10, 2001

(54) PLASMA PROCESSING APPARATUS WITH COILS IN DIELECTRIC WINDOWS

(75) Inventors: Jyoti Kiron Bhardwaj, Bristol; Leslie Michael Lea, Didcot, both of (GB)

(73) Assignee: Surface Technology Systems Limited, Newport (GB)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/938,995

(22) Filed: Sep. 26, 1997

(30) Foreign Application Priority Data

Sep. 27, 1996 (GB) .................................................. 9620150
Oct. 22, 1996 (GB) .................................................. 9621939

(51) Int. Cl.⁷ ............................................................ H01J 7/24
(52) U.S. Cl. ................................. 315/111.51; 315/111.41; 315/111.21; 118/723 I; 118/723 IR; 118/723 AN; 156/345 C
(58) Field of Search .......................... 315/111.21, 111.41, 315/111.51; 118/723 I, 723 IR, 723 AN; 156/345 C

(56) References Cited

U.S. PATENT DOCUMENTS

| | | | |
|---|---|---|---|
| 4,496,425 | 1/1985 | Kuyel | 156/626 |
| 4,990,229 | * 2/1991 | Campbell et al. | 156/345 C X |
| 5,280,154 | 1/1994 | Cuomo et al. | 219/121.52 |
| 5,309,063 | 5/1994 | Singh | 315/111.51 |
| 5,401,350 | 3/1995 | Patrick et al. | 156/345 |
| 5,468,296 | 11/1995 | Patrick et al. | 118/723 I |
| 5,522,934 | * 6/1996 | Suzuki et al. | 118/723 AN |
| 5,529,657 | * 6/1996 | Ishii | 118/723 I |
| 5,556,521 | * 9/1996 | Ghanbari | 156/345 C |
| 5,653,811 | 8/1997 | Chan | 118/723 I |
| 5,716,451 | * 2/1998 | Hama et al. | 118/723 I |
| 5,795,429 | * 8/1998 | Ishii et al. | 118/723 I X |
| 6,054,013 | 4/2000 | Collins et al. | 118/723 I |
| 6,077,384 | 6/2000 | Collins et al. | 118/723 I |

FOREIGN PATENT DOCUMENTS

| | | |
|---|---|---|
| 43 19 717 A1 | 12/1993 | (DE) . |
| 0 280 074 A2 | 8/1988 | (EP) . |
| 0 489 407 A2 | 6/1992 | (EP) . |
| 0 601 468 A1 | 6/1994 | (EP) . |
| 0 607 797 A1 | 7/1994 | (EP) . |
| 0 674 334 A1 | 9/1995 | (EP) . |
| 0 690 666 A1 | 1/1996 | (EP) . |
| 0 710 055 A1 | 5/1996 | (EP) . |
| 0 727 807 A1 | 8/1996 | (EP) . |
| 0 727 923 A1 | 8/1996 | (EP) . |
| WO 95/15672 | 6/1995 | (WO) . |
| WO 96 18208 | 6/1996 | (WO) . |
| WO 97 04478 | 2/1997 | (WO) . |

OTHER PUBLICATIONS

Patent Abstract of Japan vol. 095, No. 006, Jul. 31, 1995 & 07 086179 A (Hitachi LTD), Mar. 31, 1995, see abstract.
Patent Abstract of Japan vol. 095, No. 008, Sep. 29, 1995 & JP 07 122399 A (Tokyo Electron LTD), May 12, 1995, *abstract*.

* cited by examiner

*Primary Examiner*—Justin P. Bettendorf
(74) *Attorney, Agent, or Firm*—Jones Volentine, PLLC

(57) ABSTRACT

A wafer processing chamber 11 includes a wafer support 12, a dielectyric window 13 and coaxial coils 15 and 16 located outside the dielectric window 13 for inducing a plasma within the chamber. A variety of coil/dielectric windows are described together with protocols for their control.

14 Claims, 11 Drawing Sheets

PLASMA PROCESSING APPARATUS WITH COILS IN DIELECTRIC WINDOWS

BACKGROUND OF THE INVENTION

This invention relates to plasma processing apparatus.

Plasma processing apparatus is used extensively in the fabrication of semiconductor devices and in many other processes in which the deposition of coatings or the etching of surfaces is required. Particularly when these processes are being carried out on a production scale, uniformity between batches becomes extremely important.

Generally such plasmas are generated in a vacuum chamber and it is preferred that the means for generating the plasma is either located outside the chamber or within a protective wall, in order to reduce the disturbance to the plasma potential when ratio frequency power is applied.

Thus there have been suggestions of surrounding the plasma chamber by a single coil as in U.S. Pat. No. 4,844,775 and a number of Parties have suggested placing a single spiral coil against one end of a processing chamber. An example of this is EP-A-0379828. Usually a dielectric window is provided adjacent the coil. U.S. Pat. No. 5,309,063 describes a variation on this in which the single coil in re-entrant into the plasma chamber within a dielectric cup and proposals have been made in U.S. Pat. No. 5,280,1154 and U.S. Pat. No. 5,397,962 for a plurality of spaced antennae located so as to allow the creation of rotating electro-magnetic fields.

However, all of these proposals suffer to one degree or another from lack of uniformity in the plasma, for example in the vicinity of a workpiece. In some cases a controlled lack of uniformity is desirable. This would be difficult to achieve with the prior art arrangement, but can be provided by at least some embodiments of the invention.

SUMMARY OF THE INVENTION

From one aspect the present invention consists in plasma processing apparatus including a processing chamber having a working volume of regular cross-section such that an axis passes through the centre of symmetry of a pair of opposed faces of the volume, and a plurality of Radio Frequency (RF) plasma generating antennae for predominately inducing an electric field, each having a coil portion of geometric shape corresponding to the shape of the cross-section, disposed at or adjacent to a wall of the chamber with the portions being coaxial with each other and with said axis.

The matching of the geometry of the coils with the cross-section of the working volume of the chamber means that the plasma which is struck conforms essentially to the chamber. Further the provision of these independent coils in this array allows independent control of the coils and hence control of the plasma between different parts of the working volume. Thus, in a preferred embodiment, the apparatus further comprises means for varying the effective output of the antennae. For example the means may vary the magnitude, frequency and/or relative phase of the RF power supplied and/or the relative spacing between the coils and the working volume.

The cross-section, and hence the coil portions, may be circular, square, rectangular, hexagonal or octagonal. The coil portions may surround the chamber, but it is preferred that they are disposed adjacent to or on the end of the chamber. The chamber may include at least one dielectric window adjacent to a coil portion. This window may be re-entrant relative to the chamber and there may be a plurality of windows each extending parallel to and extending over at least the width of an associated coil portion. Thus, when the coil portions are generally circular, there may be a series of spaced annular windows.

The apparatus may further include at least one detector for detecting the degree of uniformity of the plasma or of a plasma driven process and feedback means for varying the effective relative outputs of the antennae to improve the uniformity.

From another aspect the invention consists in plasma processing apparatus including a processing chamber having a working volume, at least one Radio-Frequency (RF) plasma generating antennae, the or each antennae being disposed in respective dielectric troughs located in a wall of the chamber.

The or each antennae may be non planar and may transfer power through at least one wall and the base of the trough, in which case one turn may lie adjacent one wall of the trough, another adjacent the other wall and a third adjacent the base.

From a still further aspect the invention consists in plasma processing apparatus wherein the antennae are separated by at least twice the skin depth of the intended plasma.

The invention further includes plasma processing apparatus including a processing chamber having a working volume, a plurality of Radio-Frequency (RF) plasma generating antennae, and separated by at least twice the skin depth of the intended plasma.

Although the invention has been defined above it is to be understood that it includes any inventive combination of the features set out above in the following description.

BRIEF DESCRIPTION OF THE DRAWINGS

The invention may be performed in various ways and a specific embodiment will now be described, by way of example with reference to the following drawings, in which.

DETAILED DESCRIPTION

Figure 1:
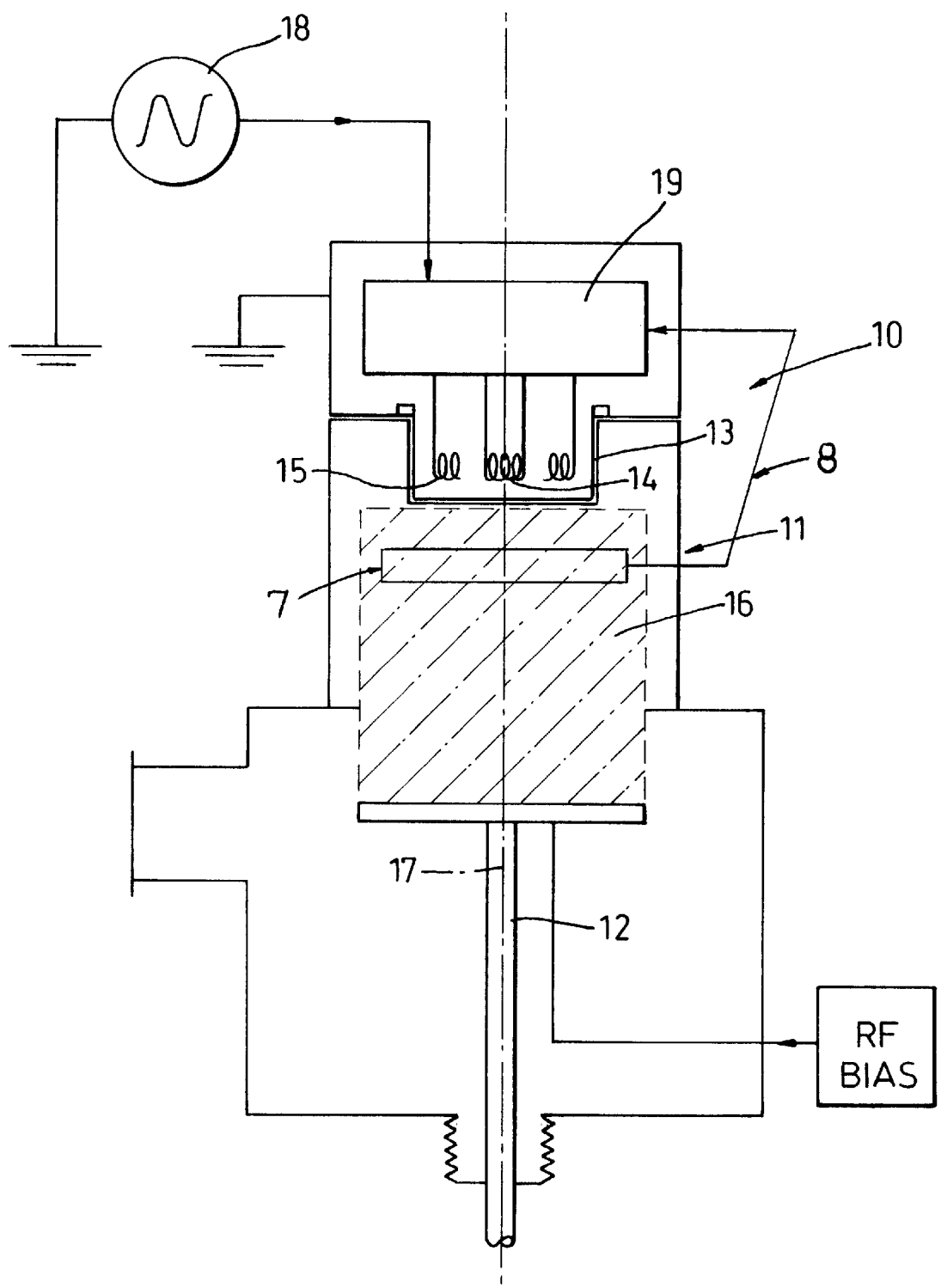
FIG. 1 is a schematic drawing of plasma process apparatus.

FIG. 1 shows a plasma processing apparatus 10 in schematic vertical cross-section. It includes the wafer processing chamber 11 and the means 12 by which a wafer is supported and moved to the appropriate level for processing. The processing chamber 11 is generally a metal container of circular or rectangular cross-section, although other multi-sided forms are possible. One or more ports will exist to permit gas to be admitted and possibly diagnostics. A part 13 of the chamber 11, or re-entrant module, is constructed out of a dielectric material and electrical coils 14,15 (two of which are shown by way of example) are locate outside of this dielectric part 13 and are used to couple radio frequency power into the plasma within the chamber 11. The chamber contains a cylindrical or rectangular working volume 16 in which the plasma is struck. This volume has an axis 17 which passes through the centres of symmetry of its end faces.

In order to improve the confinement of the plasma within the chamber and therefore increase the plasma density, magnets (not shown) may be located in particular orientations around the walls and/or top of the chamber 11. The use of small permanent magnets for this purpose is well known and is applicable to all embodiments described.

Under normal operating conditions a high vacuum is maintained within the chamber 11, which necessitates that the part 13 constructed out of dielectric material is appropriately sealed to the main structure of the chamber 11.

The coils for coupling radio frequency power into the plasma are located close to the surface of the dielectric section in order to produce an efficient transformer action into the plasma. They may be wound in a number of forms as described later.

Radio frequency power produced in an appropriate power supply 18, is fed to each of the coils 14,15 by an impedance matching system 19. This system present a constant impedance to the power supply, while allowing the RF power fed to each coil 14,15 to be controlled. Alternatively separate power supplies and impedance matching systems may be used for each coil, or other variations of the system. The control of the RF power fed to each coil may be by operator intervention. Alternatively, and of potentially greater application, it may be by control signals received from a detector 7 which monitors the plasma or process spatial uniformity, thereby forming a feedback loop 7. Thus, by way of examples more RF power may be coupled to the plasma by coils 14,15 further from the axis of symmetry 17, enabling the all loses of plasma, which usually occur to be compensated for.

Figure 2:
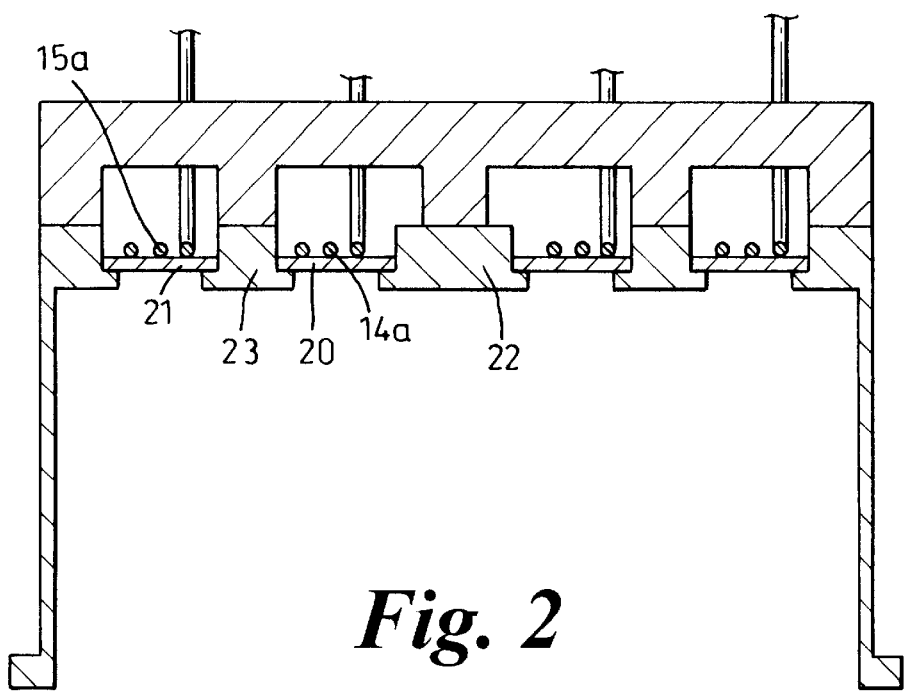
FIG. 2 is a cross-sectional view through a coil assembly for use in the apparatus of FIG. 1.

Details of coil configurations are shown in FIG. 2 and following the Figures. In all cases multiple coils are used, permitting control of the plasma spatial uniformity by adjustment of the magnitude, frequency or relative phase of the radio frequency power fed to each coil, or by adjustment of the physical position of each coil.

Figure 3:
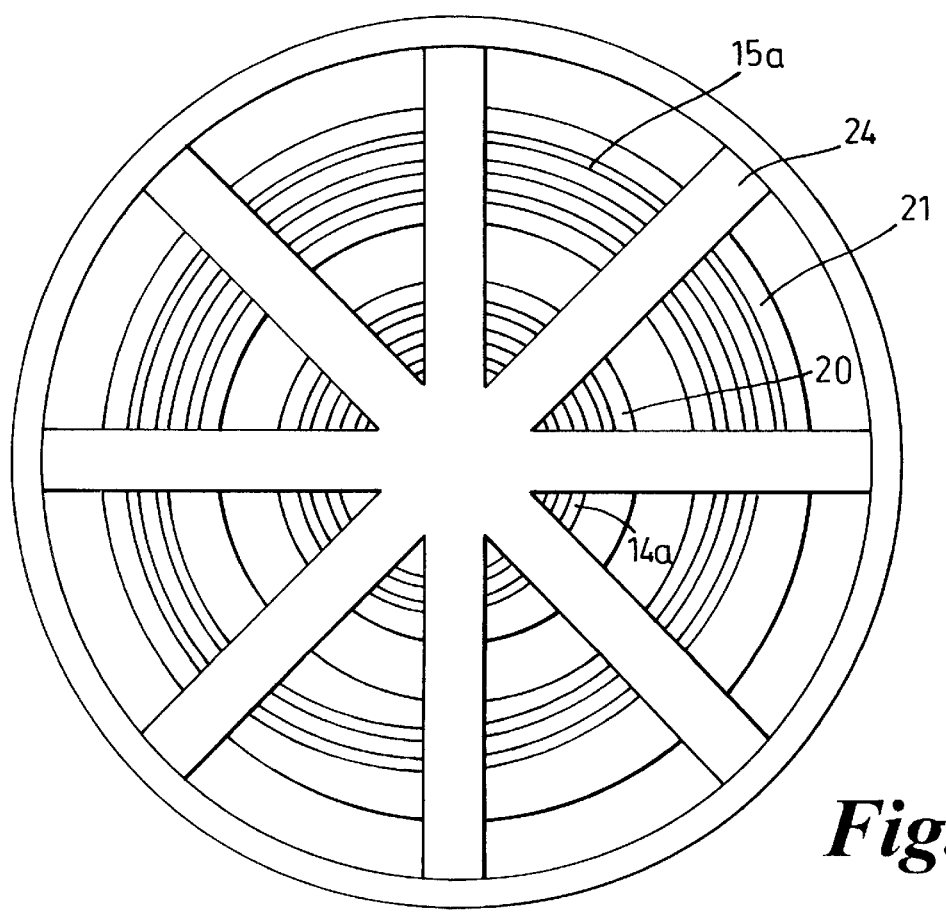
FIG. 3 is a view from above of the assembly of FIG. 2.

FIGS. 2 and 3 show a design in which each coil 14a, 15a is of planar, or close to, annular spiral form and is placed behind a corresponding annular ring 20,21 of dielectric material set in the top of the plasma chamber 11. However, coils of the type shown in FIG. 14 and 15 may advantageously replace the coils 14a and 15a to enhance the power transfer. In that case the rings 20, 21 will be replaced by dielectric troughs. Since the supporting structure 22,23 for the annular dielectric rings is also annular in form, a number of substantial bracing struts 24 are required to provide support against the forces encountered when the chamber is evacuated. Under some circumstances, particularly when the innermost coil is of small diameter, the innermost dielectric ring 20 may be replaced with a circular disc of dielectric material, thereby removing the requirement for the central support.

As an alternative to the dielectric ring structure, a single disc of dielectric material may be used with the annular spiral coils set behind it. This approach reduces the complexity of the system, but brings the disadvantage that because of its large diameter the dielectric disc must be constructed from thick material in order to withstand the close to atmospheric pressure differential across it. The efficiency with which radio frequency power can be coupled into the plasma is reduced as the distance between the coils and the plasma is increased.

When a planar annular spiral coil is located outside of a dielectric window and a plasma is formed in the chamber below the coil, then the RF magnetic field lines will be almost radial for the greater part of the distance that they intersect the plasma. From Faraday's law, an azimuthal electric field and an associated current are induced within the plasma. The plasma current opposes the direction of the coil current and is confined to a layer near the window having a thickness of the order of the skin depth for penetration of RF into the plasma.

Provided that separate coil units are sufficiently well spaced apart, the interaction between coil units will be minimal and each may be treated separately.

While circular coils and cylindrical working volume have been described in connection with this and the following embodiments, this does not preclude the use of planar annular rectangular coils, or hexagonal coils, or coils of any other shape appropriate to the plasma chamber or working volume. The dielectric window, when used in the various embodiments, may then be in one piece to suit the coil shape or in annular sections of appropriate shape.

The coils in every case may be constructed out of single or multiple strands of conducting material of circular, square, hexagonal or other appropriate cross-sectional form, or particularly for high power operation, the coils may be formed out of tubular conducting material through which water or another suitable coolant can be passed.

For all embodiments the gas feed to the chamber may be via a plenum feeding a series of small equispaced holes in a ring about the axis of symmetry of the working volume, set in an appropriate support ring between dielectric rings. This does not preclude, however, the use of additional/alternative gas feed points at other positions in the chamber.

Further, to improve plasma confinement in the chamber, small permanent magnets may be located in suitable slots in some or all of the support rings, in addition to any that are located on the side walls of the chamber.

Figure 4:
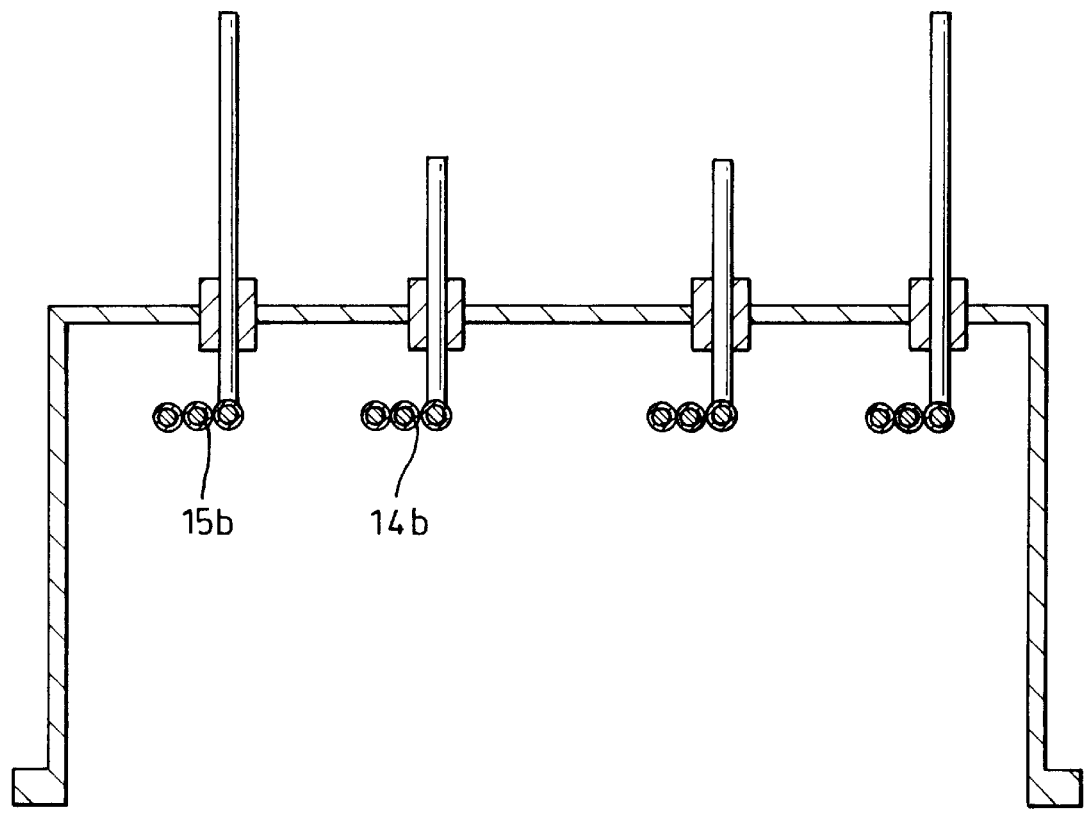
FIG. 4 illustrates an alterative coil assembly.

FIG. 4, shows a design in which a number of annular planar, or near planar, coils 14b, 15b are located inside the plasma chamber. Each coil is electrically insulated from the plasma by means of continuous solid, or flexible insulating material around each individual turn of each coil or around each complete coil unit. Electrical connections to each coil unit are brought into the plasma chamber through suitable vacuum seals in the chamber walls or top.

The coils, at least as shown in FIGS. 2 to 4, may be single turn coils and as such neither planar coils nor solenoids. In some instances a mixture of single turn and multiple turn coils may be used.

Figure 5:
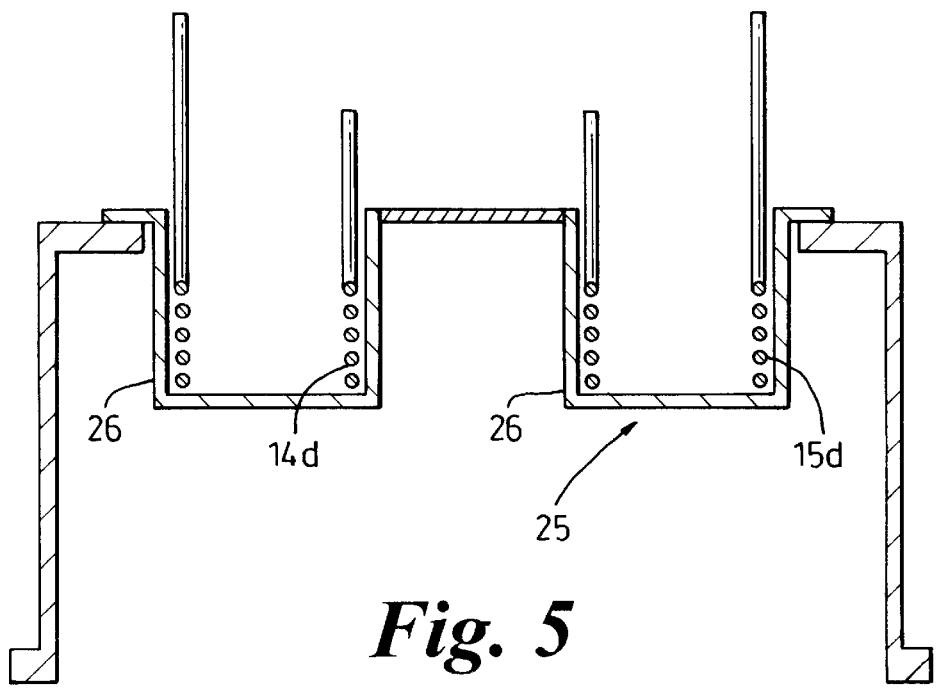
FIGS. 5 and 6 are respective vertical sections and plan views of a further coil assembly.
Figure 6:
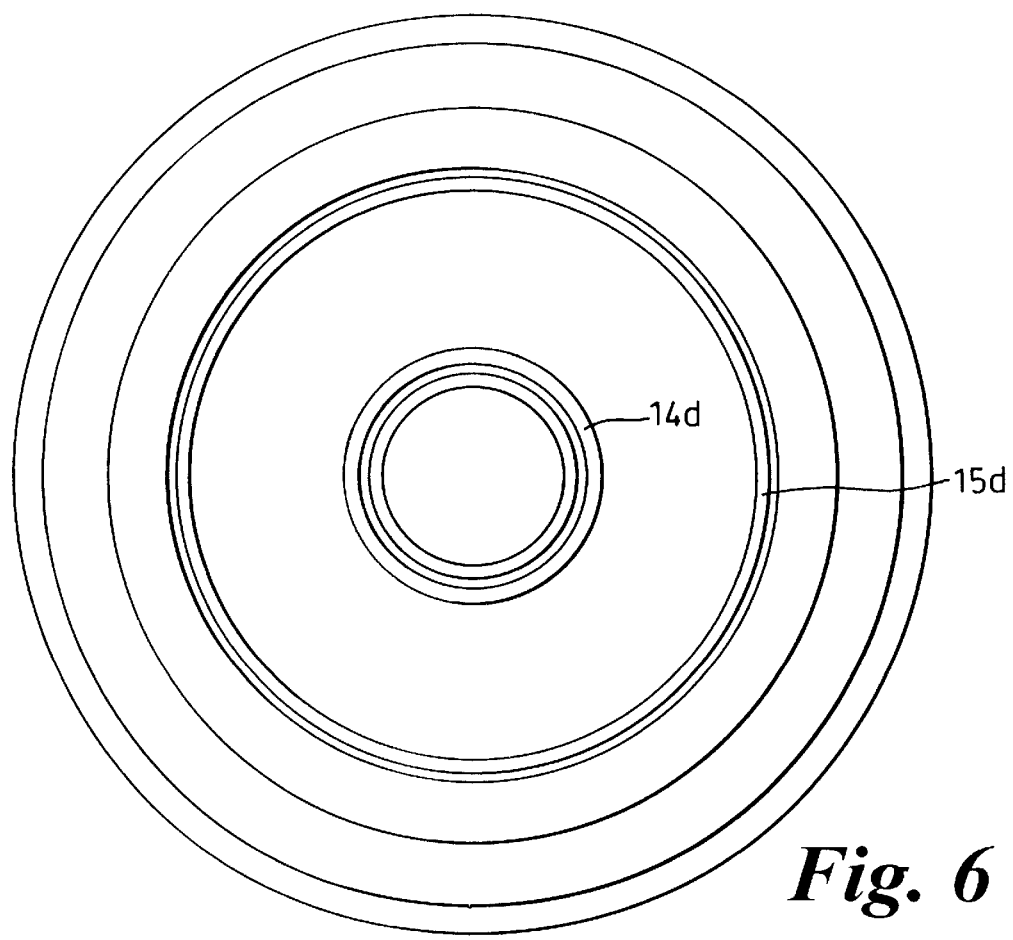

FIGS. 5 and 6, show a design in which a circularly symmetric assembly 25 constructed wholly or partially out of a dielectric material, is re-entrant in to the top of the chamber. The coils 14d, 15d are solenoidal form and are located on the outside of the assembly, adjacent to the sidewalls 26 of the assembly 25, which may be vertical or set at an appropriate angle to the axis. The centre of each coil 14d and 15d falls on the axis of symmetry 17.

As has been mentioned above, when a solenoidal coil is located outside of a dielectric window and a plasma is formed in the chamber, either inside or outside of the coil depending on the position of the window, then the RF magnetic field lines will be almost parallel to the coil axis (for a solenoid of constant diameter), for the greater part of the distance that they intersect the plasma. From Faraday's law, an azimuthal electric field and an associated current are induced within the plasma. The plasma current opposes the direction of the coil current and is confined to a layer near the window having a thickness of the order of the skin depth for penetration of RF into the plasma. Provided that separate coil units are sufficiently well spaced apart, the interaction between coil units will be minimal and each may be treated separately.

Thus, as can be seen from the derivation in, for example, "Principles of Plasma Discharges and Materials Processing". M A Lieberman and A. J. Lichtenberg (Wiley 1994) the skin depth $$\delta = \left(\frac{m}{e^2 \mu_o n_s}\right)^{1/2}$$

where m is the electron mass e is the charge on the electron $\mu_o$ is the permeability of free space and $n_s$ is the electron density at the plasma edge.

In inductively coupled plasmas, the electron density is typically of order $1 \times 10^{17} m^{-3}$, or greater, giving a skin depth of 17 mm or less.

Thus if the antennae are separated by at least twice the skin depth, they will couple into separate regions of space. The Applicants will usually space the antennae by around 100 mm and so do not seek to create a uniform plasma immediately in front of the antennae, but rather create local regions of dense plasma which by diffusion form a uniform plasma above a substrate placed at an appropriate distance away from the antennae. This arrangement is particularly suitable for a feed back control system such as described in our co-pending PCT Application filed on Sep. 24, 1997, and entitled "Plasma Processing Apparatus", which is incorporated herein by reference.

The design shown in FIGS. 5 and 6 utilises multiple solenoidal coils. At least one coil is adjacent to a section of the dielectric structure 26 which has smaller radius than the coil, and at least one coil is adjacent to a section of the dielectric structure 26 which has larger radius than the coil. Radio frequency power is coupled to those regions of the plasma inside of the chamber which are separated by the dielectric structure from the adjacent coil. The double hatched section 26 may be either of dielectric or conductive material.

Figure 7:
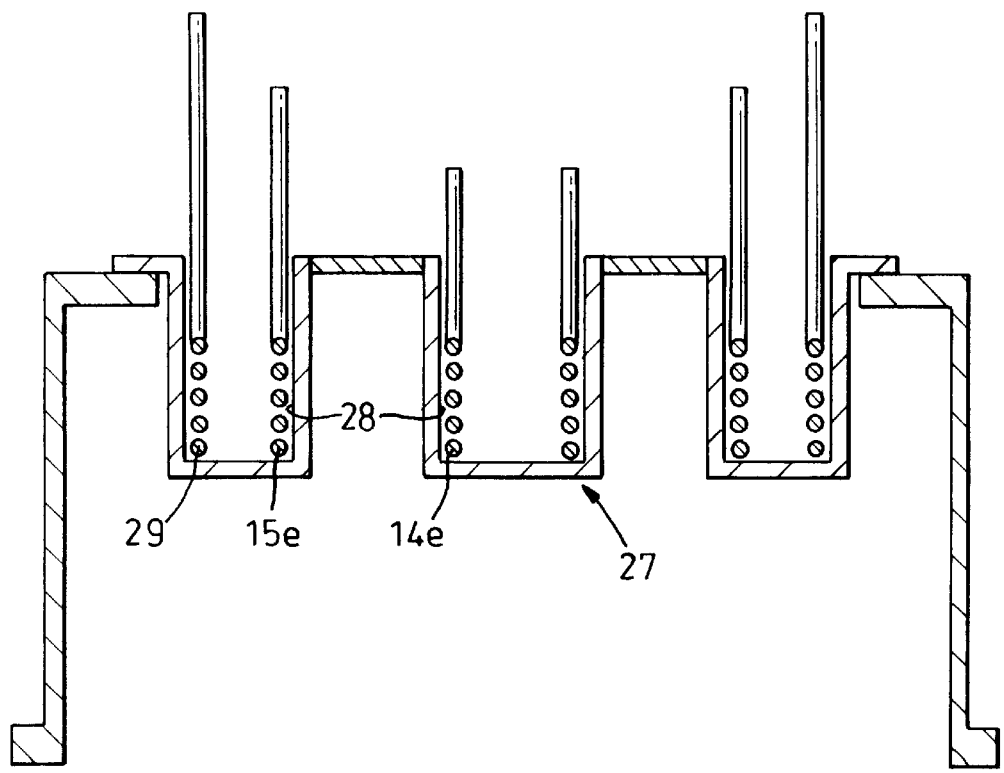
FIG. 7 is a vertical section through yet another coil assembly.
Figure 8:
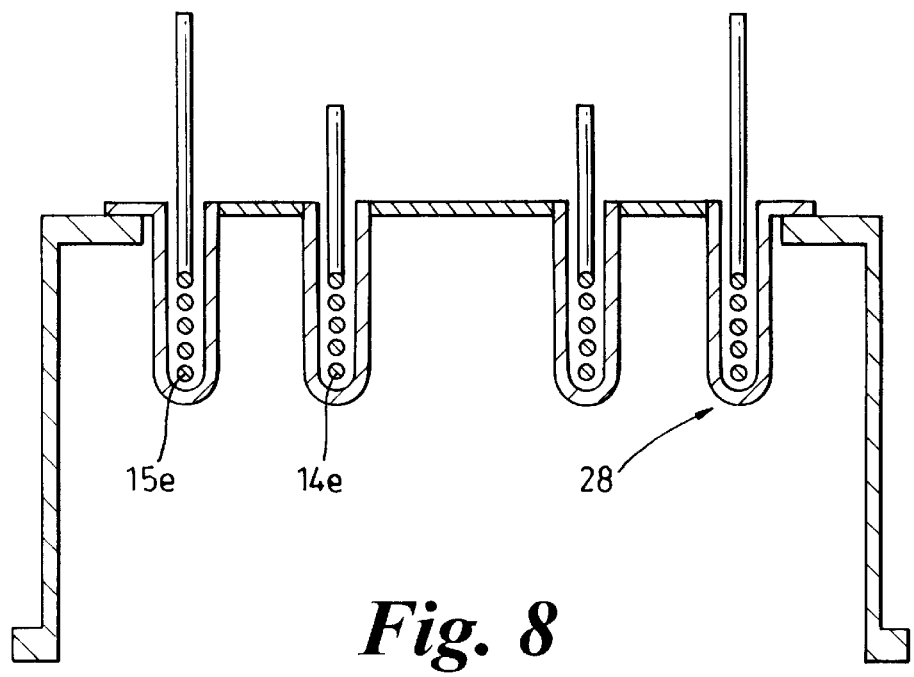
FIGS. 8 and 9 are a vertical section and a plan view respectively through a further coil assembly.
Figure 9:
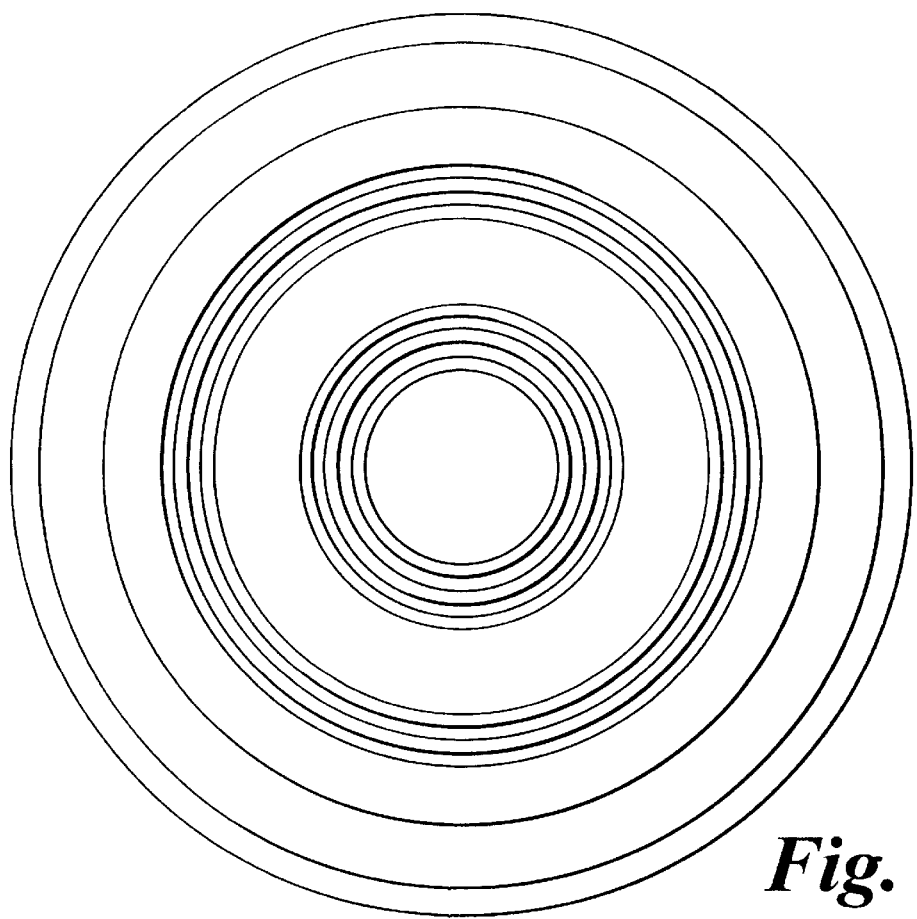

FIGS. 7, 8 and 9, shows designs in which a circularly symmetric assembly 27 constructed wholly or partially out of a dielectric material, is re-entrant into the top of the chamber. (The cross-hatched areas can once again be dielectric or conductive). The coils 14e, 15e and 29 are of solenoidal form and are located on the outside of the assembly in axially symmetric channels 28. The centre of each coil falls on the axis of symmetry 17. The coils 14e, 15e are located in channels 28 of dielectric material, appropriate to their shape.

In the arrangements shown in FIGS. 8 and 9 each coil can couple to both the region of the plasma which is formed at a smaller radius than the coil, and that region which is at a larger radius than the coil.

Figure 10:
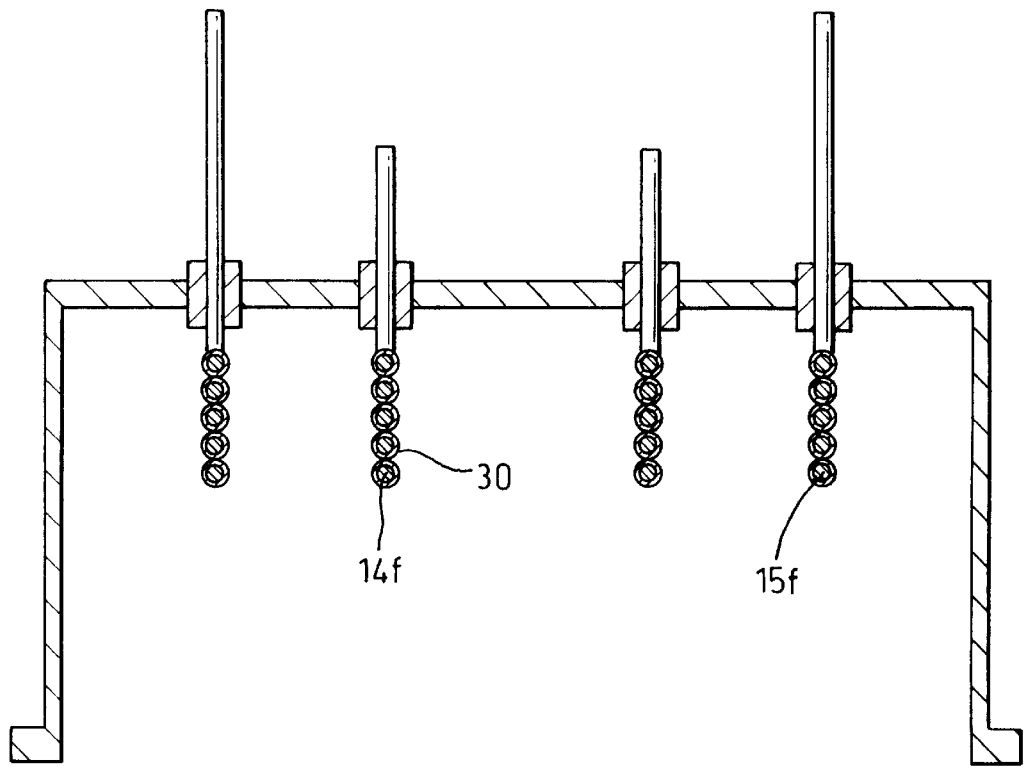
FIG. 10 is a vertical section through yet another embodiment of the coil assembly.

FIG. 10, shows a design in which a number of axially concentric solenoidal coils 14f, 15f are located inside the plasma chamber 11. Each coil 14f, 15f is electrically insulated from the plasma by means of continuous solid, or flexible insulating material 30 around each individual turn of each coil or around each complete coil unit. Electrical connections to each coil unit are brought into the plasma chamber through suitable vacuum seals in the chamber walls or top.

Figure 11:
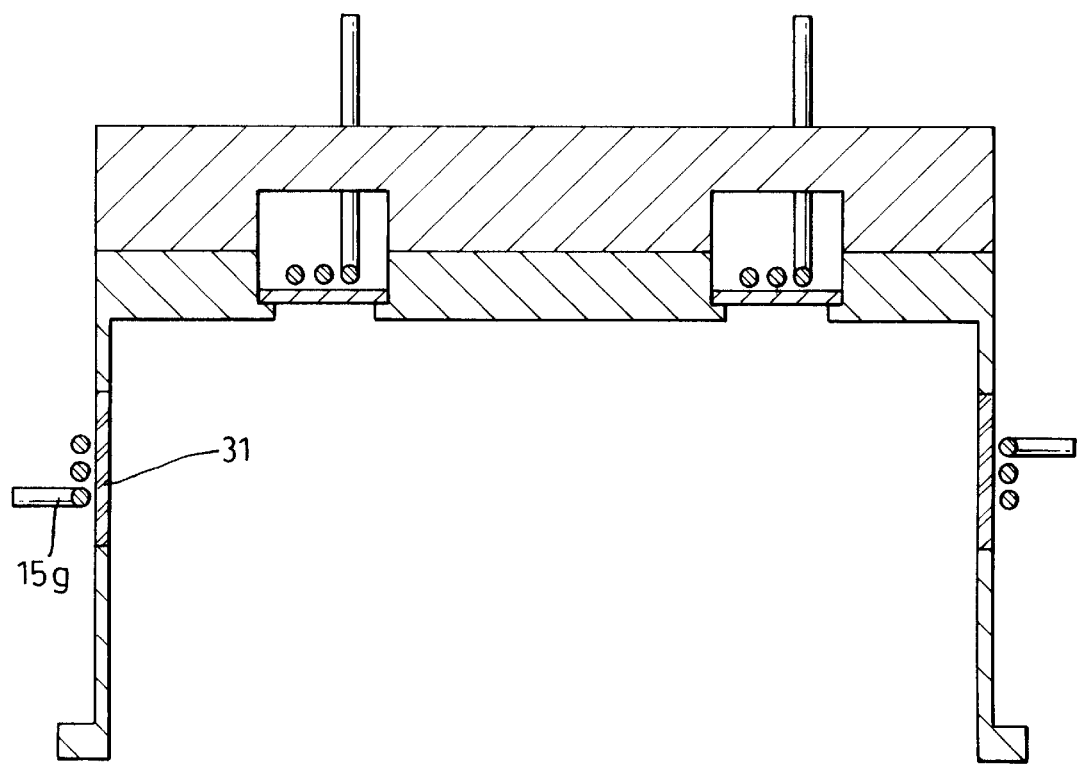
FIG. 11 is a vertical section through a still further coil assembly.

As is illustrated in FIG. 11, at least one of the co-axial coils may be constituted by an annular coil 15g extending around the wall of the chamber adjacent an annular dielectric window 31. Once more the number of turns shown is merely exemplary, and it will be understood that appropriate sealing provision will need to be made for the dielectric window 31. A man skilled in the art would be familiar with the sealing methods required. Further, an external yoke or the like would need to be provided to provide strong mechanical attachment or location between the parts of the chamber which are on opposite sides of the window 31.

As has been mentioned above, radio frequency power may be inductively coupled to the plasma within a processing chamber through a dielectric window, with the antenna adjacent to the opposite side of the window to that facing the plasma. The window serves to maintain the pressure differential between the low pressure interior of the chamber where the plasma is formed and the, usually, atmospheric pressure exterior where the antenna is located.

The dielectric window frequently forms part of one end or part of the side walls of the chamber. When multiple antennas are utilised it may be advantageous to use a number of small separate dielectric windows each dedicated to a particular antenna, in order to balance the need for thin windows for high RF coupling efficiency with the need for windows of adequate thickness to withstand the pressure differential across them. Such arrangements are shown in for example in FIGS. 2, 5, 7 and 8.

In particular antenna(s) may be located in trough(s) constructed out of dielectric material set into the end or side of a chamber. For a cylindrical chamber concentric circular troughs may be set into the end of the chamber. The design is not, however limited to cylindrical chambers, and troughs of dielectric material may be formed in other shapes appropriate to a specific chamber.

Three further designs of antennas to operate with dielectric windows in trough form are described in connection with FIGS. 12 to 17. The descriptions are with respect to cylindrical geometry for the dielectric trough, but are not intended to preclude the application of similar designs to other geometries. In each case a single antenna of one or more turns is located in each dielectric trough.

Figure 12:
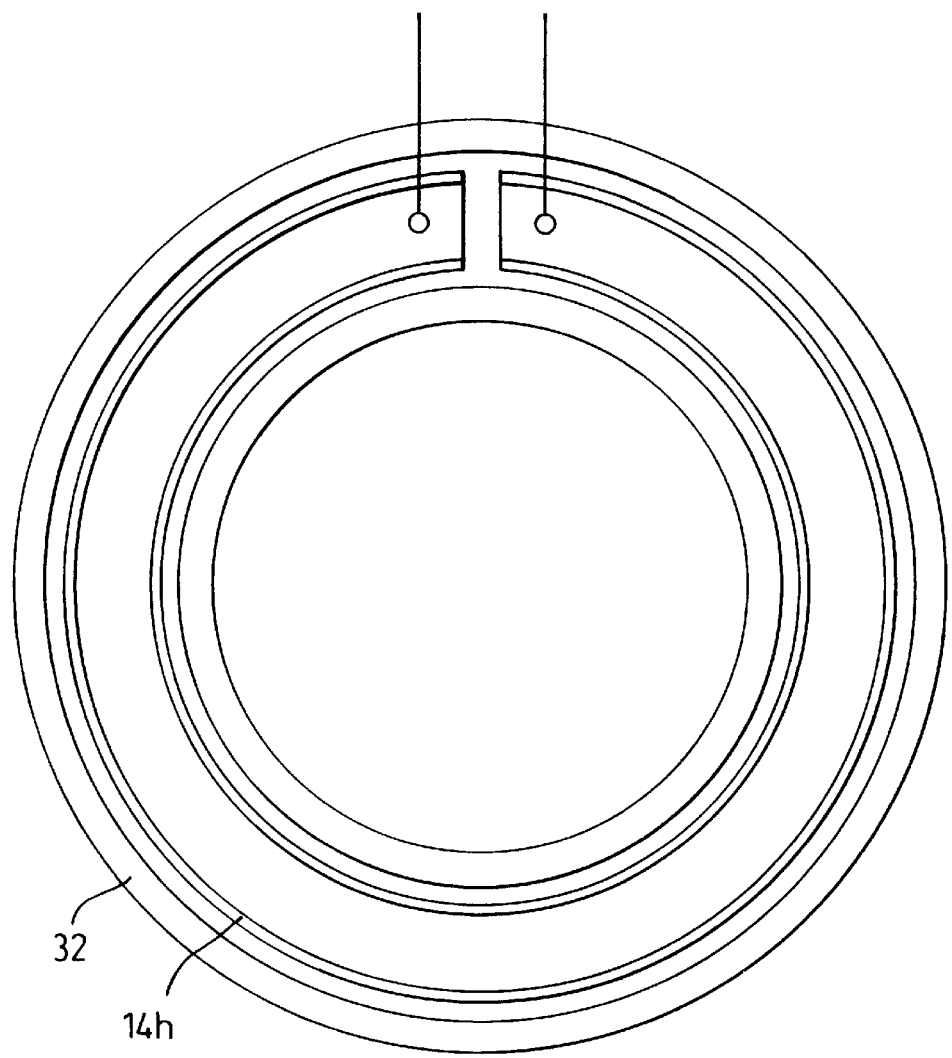
FIGS. 12 and 13 are a plan view and a vertical section respectively of an additional coil assembly.
Figure 13:
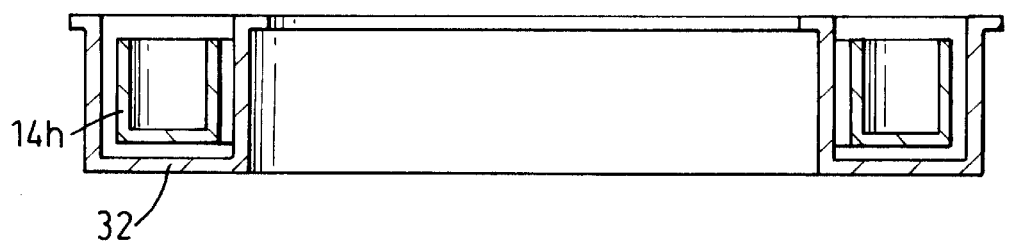

The first design is shown in FIGS. 12 and 13. The antenna 14h is a single turn coil with a profile which approximates the profile of its dielectric trough 32. Variations include the attachment of a cooling fluid pipe to the inner surface or closure of the fourth side to form a rectangular section pipe. The current flowing in the coil 14h induces an electric field and associated current in the plasma on the other side of the dielectric trough 32. Because of the geometrical shape of the dielectric trough 32 and antenna 14h, power is coupled to plasma below and on both sides of the trough. Thus power is coupled into a relatively large volume of the plasma whilst maintaining a relatively small, structurally strong dielectric window. This non-planar design of antenna may be used in each of a number of concentric dielectric trough windows on a multi antenna plasma chamber.

Figure 14:
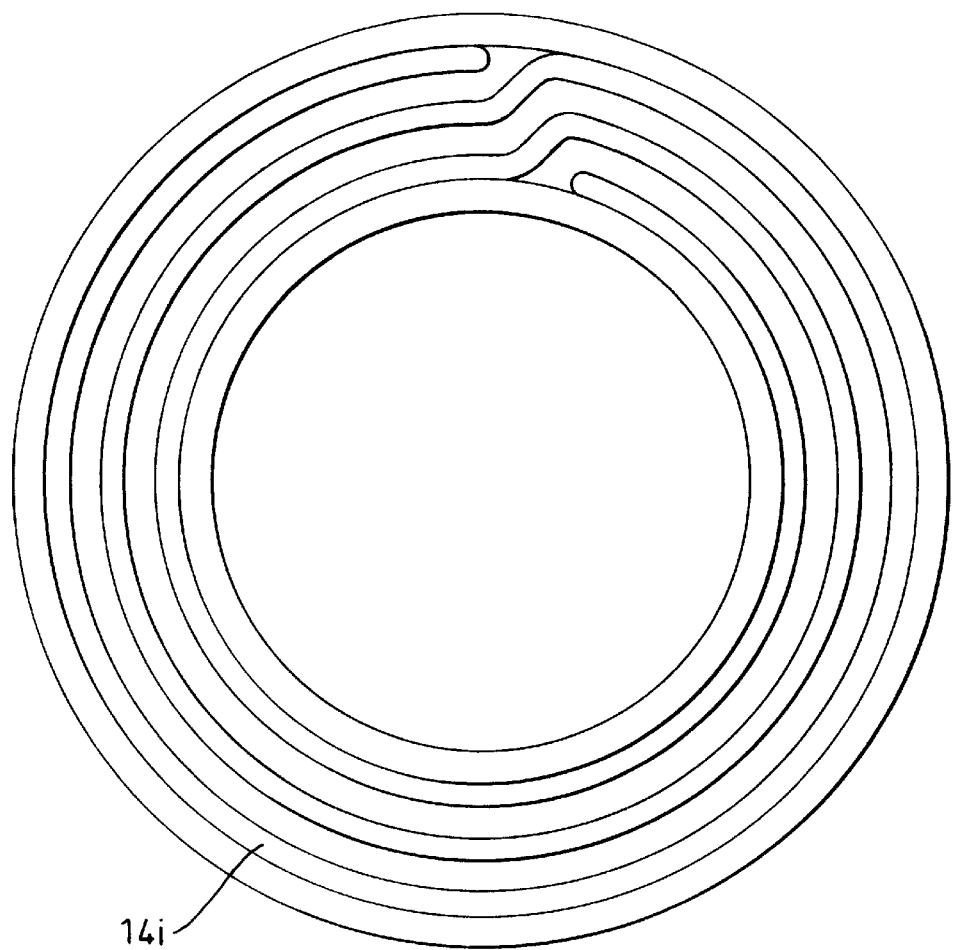
FIGS. 14 and 15 are a plan view and a vertical section respectively another coil assembly.
Figure 15:
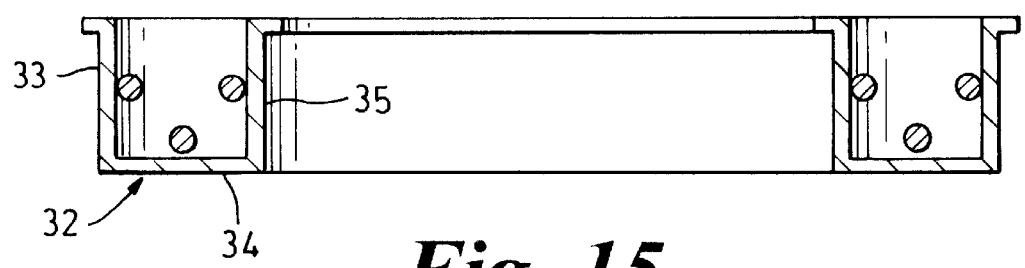

In FIGS. 14 and 15 a second non-planar design of antenna 14i is shown. The antenna 14i is a three turn coil which is arranged so that one turn is wound adjacent to one side wall 33 of its dielectric trough 32, the second turn is wound adjacent to the bottom 34 of the trough and the third turn is wound adjacent to the second side wall 35 of the trough. Each turn of the coil thus couples power into the plasma adjacent to the respective side of the trough 32 and therefore increases the volume of plasma into which power is coupled. The coil is shown as wound with circular section material, but other sections may be used, and the material may be any of multi stranded wire, rod or tube, through which a cooling fluid may be passed. Although a three turn coil is shown, this does not preclude the use of more or less turns e.g. 2 turns one near the bottom of the trough 32 and one near one side or six turns with two near each side wall and two near the bottom. A further advantage of this design of antenna is that by using more than one turn, the inductance of the coil is increased compared with a single turn coil, which can simplify the matching circuitry required between the RF power supply and the antenna. Antennas of this design may be located in each of a number of concentric dielectric trough windows on multiple antenna systems.

Figure 16:
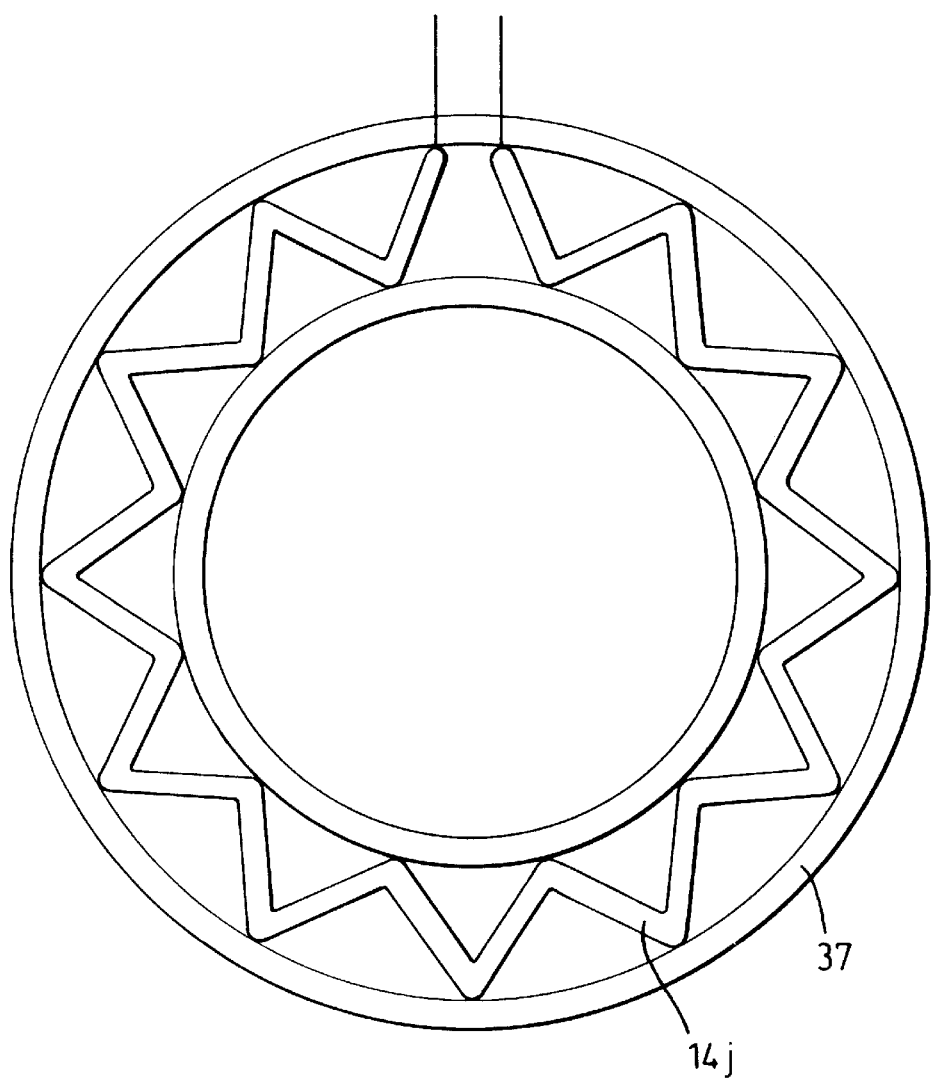
FIG. 16 is a plan view of a further coil assembly.
Figure 17:
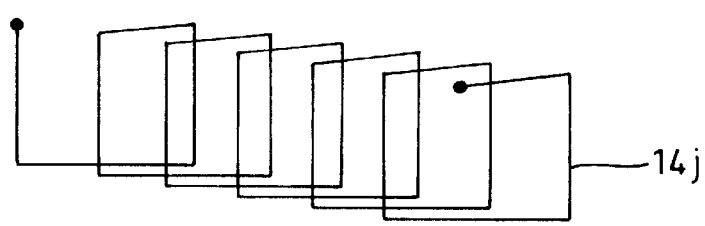
FIG. 17 is a schematic 3D representation of the coil.

The design shown in FIGS. 16 and 17 is of a single turn antenna 14j which is would in a spiral shape and is then located in a dielectric trough window 37. The spiral is wound so that sections of the coil are in close proximity to each of the three sides of the trough 37. Power is coupled into the plasma adjacent to each of the three sides of the dielectric trough. The pitch of the spiral is chosen on the basis of a number of constraints, which must be balanced, for example a tighter pitch will mean the coil passes close to a given side of the trough more often and therefore will be more effective at coupling power into the local plasma, while the length of the wire, rod or pipe used to construct the coil will be longer leading to greater ohmic losses.

It will be understood that the use of multiple nested coils enables a large scale plasma source to be constructed and hence provides the opportunity of processing workpieces of greater area. Although coils and chambers of regular cross-section have been described, many of the advantages of nested coils can be equally obtained where the cross-section, and hence the coil is not regular, e.g. when it is kidney shaped.

What is claimed is:

1. Plasma processing apparatus comprising:
   a processing chamber having a working volume of a regular cross-section such that an axis passes through the centre of symmetry of a pair of opposed end faces defining opposite ends of the working volume;
   a plurality of Radio Frequency (RF) plasma generating antennae for predominately inducing an electric field in the working volume, each antennae having a coil portion of a geometric shape corresponding to the shape of the regular cross-section, the plurality of antennae being disposed coaxially with each other and with said axis; and
   a plurality of discrete and spaced apart windows located on the end faces and extending into the working volume, said plurality of windows respectively containing said plurality of antennae.

2. Apparatus as claimed in claim 1 further comprising means for varying the effective relative output of the antennae.

3. Apparatus as claimed in claim 2 wherein the varying means varies the magnitude, frequency and/or relative phase of RF power supplied and/or the relative spacing between the coils and the working volume.

4. Apparatus as claimed in claim 2 wherein the cross-section, and hence the coil portions, is circular, square, rectangular, hexagonal or octagonal.

5. Apparatus as claimed in claim 1 wherein the coil portions are disposed adjacent or on the end of the chamber.

6. Apparatus claimed in claim 5 wherein the antennae are separated from each other by at least twice the skin depth of the intended plasma.

7. Apparatus as claimed in claim 1, wherein each of the windows is in the form of a trough.

8. Apparatus as claimed in claim 7 wherein the coil has multiple turns with respective turns disposed adjacent to the sides and base of the trough.

9. Apparatus as claimed in claim 7 wherein the coil is in the form of a spiral that extends along the trough with section of the coil adjacent to each of the side walls and the base of the trough.

10. Apparatus as claimed in claim 1 including at least one detector for detecting the degree of uniformity of the plasma or a plasma driven process and feedback means for varying the effective relative outputs of the antennae to improve the uniformity.

11. Apparatus as claimed in claim 1 wherein the cross-section, and hence the coil portions, is circular, square, rectangular, hexagonal or octagonal.

12. Plasma processing apparatus comprising:
    a processing chamber having a working volume of a regular cross-section such that an axis passes through the centre of symmetry of a pair of opposed end faces defining opposite ends of the working volume;
    a plurality of Radio Frequency (RF) plasma generating antennae for predominately inducing an electric field in the working volume, each antennae having a coil portion of a geometric shape corresponding to the shape of the regular cross-section, the plurality of antennae being disposed at or adjacent to a wall of the chamber with the portions being coaxial with each other and with said axis; and
    wherein the chamber includes at least one dielectric window adjacent to the coil portion, each said at least one window being in the form of a trough, and
    wherein the coil portion is a single turn antenna in which the cross-section of the coil portion matches the internal profile of the window.

13. A plasma processing apparatus comprising:
    a processing chamber having a working volume; and
    a plurality of Radio-Frequency (RF) plasma generating antennae, the antennae being disposed in respective dielectric troughs extending into a wall of the chamber, wherein the antennae are separated from one another by at least twice the skin depth of the intended plasma.

14. Plasma processing apparatus for generating plasma comprising:
    a processing chamber having a working volume; and
    a plurality of Radio-Frequency (RF) plasma generating antennae, the plurality of plasma generating antennae being separated from one another by at least twice the skin depth of the generated plasma.

* * * * *